United States Patent
Yuzawa

(10) Patent No.: US 7,279,794 B2
(45) Date of Patent: *Oct. 9, 2007

(54) SEMICONDUCTOR DEVICE AND ELECTRONIC DEVICE, AND METHODS FOR MANUFACTURING THEREOF

(75) Inventor: Hideki Yuzawa, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/009,993

(22) Filed: Dec. 10, 2004

(65) Prior Publication Data

US 2005/0127493 A1    Jun. 16, 2005

(30) Foreign Application Priority Data

Dec. 12, 2003    (JP) .............................. 2003-414830

(51) Int. Cl.
    *H01L 23/48*    (2006.01)
(52) U.S. Cl. ...................... 257/773; 257/692; 257/778; 257/787; 257/E23.06
(58) Field of Classification Search ................. 257/773
    See application file for complete search history.

(56) References Cited

U.S. PATENT DOCUMENTS

| | | | | |
|---|---|---|---|---|
| 5,986,334 A | * | 11/1999 | Lee | 257/667 |
| 6,611,053 B2 | * | 8/2003 | Akram | 257/690 |
| 6,664,483 B2 | * | 12/2003 | Chong et al. | 174/261 |
| 6,782,615 B2 | * | 8/2004 | Shibata et al. | 29/846 |
| 6,853,092 B2 | * | 2/2005 | Ashida | 257/786 |

FOREIGN PATENT DOCUMENTS

| | | | |
|---|---|---|---|
| JP | 04-352132 | | 12/1992 |
| JP | 2000-286291 | * | 10/2000 |
| JP | 2000-323205 | | 11/2000 |
| JP | 3537699 | | 3/2004 |
| JP | 2005-93468 | | 7/2005 |

* cited by examiner

*Primary Examiner*—Minhloan Tran
*Assistant Examiner*—Eduardo A. Rodela
(74) *Attorney, Agent, or Firm*—Harness, Dickey & Pierce, P.L.C.

(57) ABSTRACT

A semiconductor device is provided including a substrate containing a wire pattern having a plurality of leads and a semiconductor chip mounted on the substrate in a manner that an electrode faces the wire pattern. The electrodes are arranged to be classified into a plurality of first groups respectively lined along a plurality of paralleling first straight lines and into a plurality of second groups respectively lined along a plurality of second straight lines extending in a direction so as to intersect with the first straight lines. Each lead includes a connecting part facing one electrode, an extension part extending along the first straight line from the connecting part, and a draw-out part that is drawn from the extension part so as to intersect with the first straight line.

18 Claims, 9 Drawing Sheets

SEMICONDUCTOR DEVICE AND ELECTRONIC DEVICE, AND METHODS FOR MANUFACTURING THEREOF

RELATED APPLICATIONS

This application claims priority to Japanese Patent Application No. 2003-414830 filed Dec. 12, 2003 which is hereby expressly incorporated by reference herein in its entirety.

BACKGROUND

1. Field of the Invention

The present invention relates to a semiconductor device and an electronic device, and method for manufacturing thereof.

2. Related Art

A semiconductor device with a semiconductor chip mounted on a substrate having a wire pattern has been known. Accordingly, if it is possible to prevent a wire of a substrate from contacting an electrode other than an object electrode, reliability of a semiconductor device can increase.

The present invention aims to provide a highly reliable semiconductor device and electronic device and methods for manufacturing thereof.

SUMMARY (1) The semiconductor device of the present invention includes a substrate having a wire pattern containing a plurality of leads and a semiconductor chip having a plurality of electrodes which are mounted on the substrate so as to face the wire pattern, wherein the electrodes are arranged to be classified into a plurality of first groups respectively lined along a plurality of paralleling first straight lines which extend along one side of the semiconductor chip and into a plurality of second groups respectively lined along a plurality of second straight lines which extend in a direction so as to intersect with the first straight lines, and wherein each lead contains a connecting part facing any one of the electrodes, an extension part extending from the connecting part along any one of the first straight lines, and a draw-out part which is drawn from the extension part and extends in a direction so as to intersect with the first straight line.

According to the present invention, the lead contains the connecting part, the extension part, and the draw-out part. Since the extension part extends along the first straight line and the draw-out part is drawn from the extension part, the draw-out part is arranged to move from the connecting part along the first straight line. Therefore, it becomes possible to position the draw-out part apart from a connecting part of other lead. Since the connecting part is facing the electrode of the semiconductor chip, the gap between the draw-out part and the electrode other than the object electrode will be wide. Therefore, an electrical short circuit between the draw-out part and the electrode does not readily occur, and, thereby, a highly reliable semiconductor device can be provided.

(2) In this semiconductor device, the extension part extending from the connecting part of one group that faces the electrode of an identical second group may be arranged to be on the same side of the connecting part as sides of two adjacent connecting parts along the first straight line.

(3) In this semiconductor device, the extension part of the one group may include one first extension part and one second extension part that is arranged next to the first extension part extending in a direction opposite from a direction in which the draw-out part extends, and the draw-out part drawn from the second extension part may be arranged to move from the first extension part in a direction in which the extension part extends.

(4) In this semiconductor device, the extension parts of the one group may be formed to have the same length.

(5) In this semiconductor device, the extension parts of the one group may be formed to be longer in an order of the arrangement along any second straight line.

(6) In this semiconductor device, the second straight line may extend in a direction perpendicular to the first straight line.

(7) In this semiconductor device, the second straight line may extend diagonally from the first straight line.

(8) In this semiconductor device, two adjacent second straight lines may extend in parallel with each other.

(9) In this semiconductor device, two adjacent second straight lines may be symmetrical around a perpendicular line of the first straight line as an axis of symmetry.

(10) The electronic device of the present invention includes a first substrate having a first wire pattern containing a plurality of lands and a second substrate having a second wire pattern containing a plurality of leads, wherein the lands are arranged to be classified into a plurality of first groups respectively lined along a plurality of paralleling first straight lines and into a plurality of second groups respectively lined along a plurality of second straight lines which extend in a direction with the first straight lines, wherein the first wire pattern contains a wire which is respectively drawn from the land and extends in a direction so as to intersect with the first straight line, and wherein each lead contains a connecting part facing any one of the lands, an extension part extending from the connecting part along any one of the first straight lines, and a draw-out part which is drawn from the extension part and extends in a direction so as to intersect with the first straight line.

According to the present invention, the lead contains the connecting part, the extension part, and the draw-out part. Since the extension part extends along the first straight line and the draw-out part is drawn from the extension part, the draw-out part is arranged to move from the connecting part along the first straight line. Accordingly, it becomes possible to position the draw-out part apart from the connecting part of other lead. Since the connecting part is facing the land, the gap between the draw-out part and the land other than the object land will be wide. Therefore, an electrical short circuit between the draw-out part and the land does not readily occur, and, thereby, a highly reliable semiconductor device can be provided.

(11) In this electronic device, the extension part of one group extending from the connecting part of one group that faces the land of an identical second group may be arranged to be on a same side of the connecting part as sides of two adjacent connecting parts along the first straight line.

(12) In this electronic device, the extension part of the one group may include one first extension part and one second extension part which is arranged next to the first extension part extending in a direction opposite from a direction in which the draw-out part extends, and the draw-out part drawn from the second extension part may be arranged to move from the first extension part in a direction in which the extension part extends.

(13) In this electronic device, the extension parts of the one group may be formed to have the same length.

(14) In this electronic device, the extension parts of the one group may be formed to be longer in an order of arrangement along any second straight line.

(15) In this electronic device, the second straight line may extend diagonally from the first straight line.

(16) In this electronic device, the two adjacent second straight lines may extend in parallel with each other.

(17) In this electronic device, two adjacent second straight lines may be symmetrical around a perpendicular line of the first straight line of the first straight line as an axis of symmetry.

(18) The method for manufacturing the semiconductor device of the present invention includes the steps of: electrically connecting the electrodes with the wire pattern by mounting a semiconductor chip having a plurality of electrodes onto a substrate having a wire pattern containing a plurality of leads in a manner that the electrodes and the wire pattern face each other; arranging the electrodes to be separated into a plurality of first groups respectively lined along a plurality of paralleling first straight lines which extend along one side of the semiconductor chip and into a plurality of second groups respectively lined along a plurality of second straight lines which extend in a direction so as to intersect with the first straight lines; wherein the wire pattern contains a plurality of connecting parts arranged to be classified into a plurality of third groups respectively lined along a plurality of paralleling third straight lines; wherein each lead contains any one of the connecting parts, an extension part extending from the connecting part along any one of the first straight lines, and a draw-out part which is drawn from the extension part and extends in a direction so as to intersect with the first straight line; and electrically connecting the electrode and the connecting part by aligning the semiconductor chip with the substrate in a manner that the first straight line and the third straight line lie in parallel with each other so that each electrode faces any one of the connecting parts.

According to the present invention, the lead contains the connecting part, the extension part, and the draw-out part. The connecting parts are arranged to be classified into a plurality of third groups along a plurality of third straight lines. Further, since the extension part extends along the third straight line and the draw-out part is drawn from the extension part, the draw-out part is arranged to move along the third straight line from the connecting part. Thus, it becomes possible to position the draw-out part apart from a connecting part of other lead. Further, according to the present invention, the semiconductor chip and the substrate are aligned in a manner that the electrode faces the connecting part. Accordingly, the gap between the draw-out part and the electrode other than the object electrode will be wide, and, therefore, an electrical short circuit between the draw-out part and the electrode does not readily occur, thereby a highly reliable semiconductor device can be provided.

(19) The method for manufacturing the electronic device of the present invention includes the steps of: electrically connecting a plurality of lands of first wire pattern mounted on the first substrate with a plurality of connecting parts of second wire pattern mounted on the second substrate by having the lands and the connecting parts to face each other; arranging the lands to be separated into a plurality of first groups respectively lined along a plurality of paralleling first straight lines and into a plurality of second groups respectively lined along a plurality of second straight lines which extend in a direction so as to intersect with the first straight lines; wherein the first wire pattern contains a wire which is respectively drawn from the land and extends in a direction so as to intersect with the first straight line; arranging the connecting parts to be separated into a plurality of third groups respectively lined along a plurality of paralleling third straight lines; wherein the second wire pattern contains an extension part which extends from a respective connecting part along any one of the third straight lines and a draw-out part which is drawn from the extension part and extends in a direction so as to intersect with the third straight line; and aligning the first substrate with the second substrate in a manner that the first straight line and the third straight line lie in parallel with each other so that each land faces any one of the connecting parts.

According to the present invention, the second wire pattern contains the connecting part, the extension part, and the draw-out part. The connecting parts are arranged to be classified into a plurality of third groups respectively extending along a plurality of third straight lines. Further, the extension part extends along the third straight line, and the draw-out part is arranged to move along the third straight line from the extension part. Therefore, the draw-out part is positioned apart from other connecting parts. Further, according to the present invention, the first substrate and the second substrate are aligned in a manner that the land faces the connecting part. Accordingly, the gap between the draw-out part and the land other than the object land will be wide. Therefore, an electrical short circuit between the draw-out part and the land does not readily occur, and, thereby, a highly reliable semiconductor device can be provided.

DETAILED DESCRIPTION

Hereinafter, embodiments of the present invention will be described with reference to the accompanying drawings. However, the present invention is not limited to the following embodiments.

The Semiconductor Device

Figure 1:
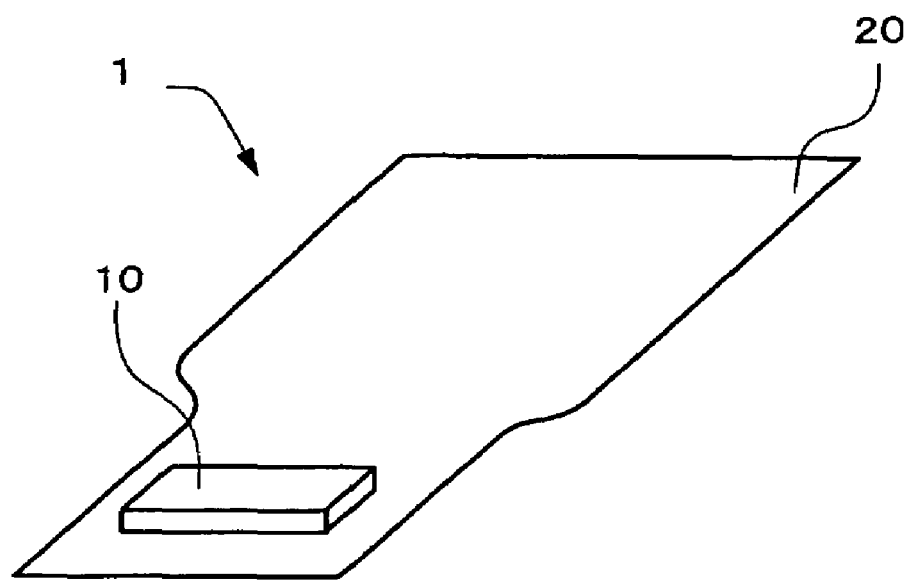
FIG. 1 is a diagram illustrating a semiconductor device of an embodiment applying the present invention.
Figure 2:
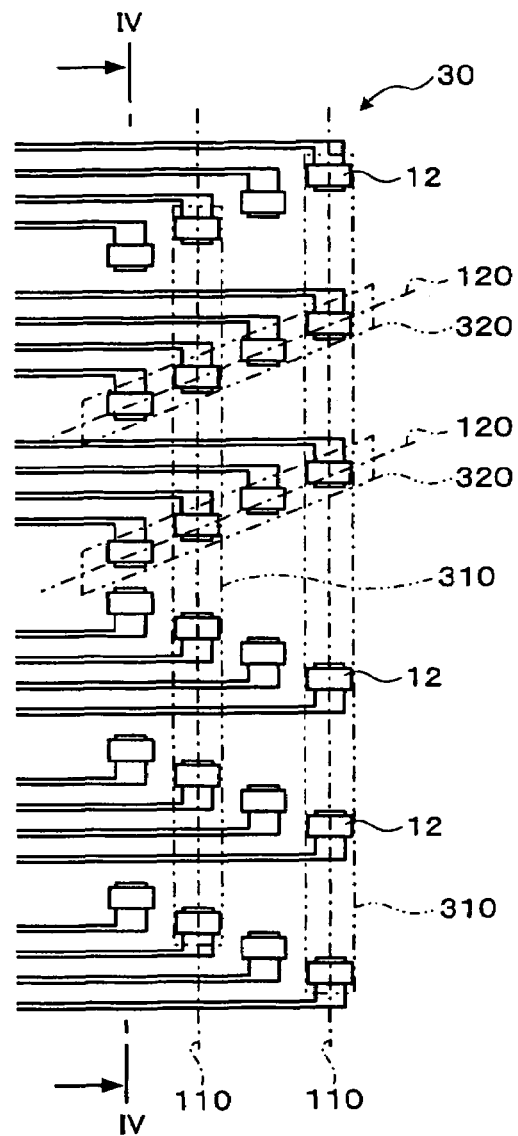
FIG. 2 is a diagram illustrating the semiconductor device of the embodiment applying the present invention.
Figure 3:
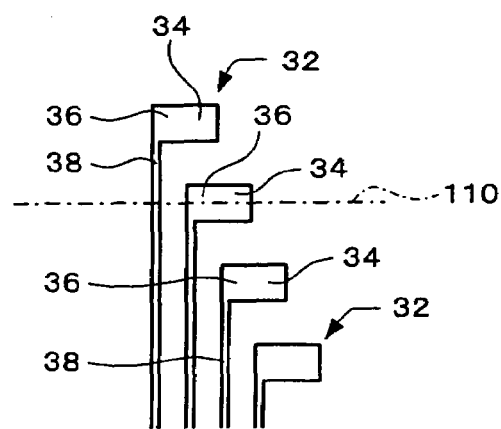
FIG. 3 is a diagram illustrating the semiconductor device of the embodiment applying the present invention.
Figure 4:
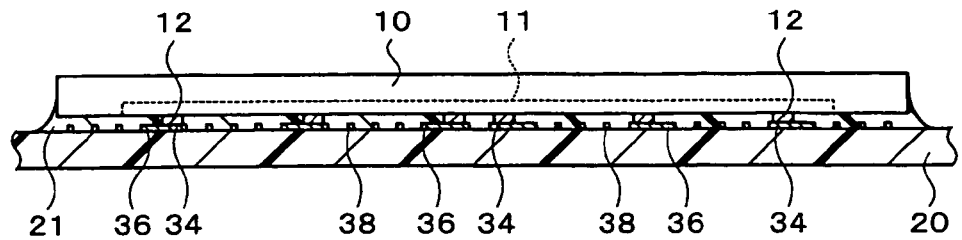
FIG. 4 is a diagram illustrating the semiconductor device of the embodiment applying the present invention.

FIGS. 1 through 4 are diagrams illustrating the semiconductor device of an embodiment applying the present invention. More precisely, FIG. 1 is a diagram outlining a semiconductor device 1 of the embodiment applying the present invention. FIG. 2 is a partially enlarged diagram of the semiconductor device 1. In FIG. 2, a semiconductor chip 10 and a substrate 20 are omitted in order to describe a connecting situation between an electrode 12 and a wire pattern 30. Further, FIG. 3 is a partially enlarged diagram of the wire pattern 30 (a lead 32). FIG. 4 is a cross-sectional view taken along a line IV-IV of FIG. 2.

The semiconductor device of the present embodiment includes the semiconductor chip 10 (see FIG. 1). The semiconductor chip 10 contains, as shown in FIG. 2 and FIG. 4, a plurality of electrodes 12. As shown in FIG. 2, the electrodes 12 are arranged to be classified into a plurality of first groups 310 respectively lined along a plurality of paralleling first straight lines 110. Further, the first straight line 110 is a straight line extending along one side of the semiconductor chip 10 (see FIG. 5). Also, as shown in FIG. 2, the electrodes 12 are arranged to be classified into a plurality of second groups 320 respectively lined along a plurality of second straight lines 120 which extend in a direction so as to intersect with the first straight lines 110. Here, the second straight lines 120 may extend diagonally from the first straight lines 110. Also, as shown in FIG. 2, two adjacent second straight lines 120 may expend in parallel with each other. Further, the electrodes 12 may be lined along two paralleling sides (or four sides) of an active surface of the semiconductor chip 10, near the edge thereof. Alternatively, the electrodes 12 may be in the form of an area array on the entire surface of the active surface of the semiconductor ship 10. The semiconductor chip 10 may include, for example, a transistor or an integrated circuit 11 composed of a memory element (see FIG. 4). The electrode 12 may be electrically connected with the inside of the semiconductor chip 10. The electrode 12 may be electrically connected with the integrated circuit 11. Alternatively, an electrode that is not electrically connected with the integrated circuit 11 may also be called as the electrode 12. The electrode 12 may include, for example, a pad and a bump formed on the pad (not shown). Additionally, although the outer shape of the semiconductor chip 10 is not limited to any particular shape, the shape may be rectangular.

The semiconductor chip 10 is mounted on the substrate 20 as shown in FIG. 1. The semiconductor chip 10 is mounted in a manner that the electrode 12 faces the wire pattern 30 (see FIG. 4).

The semiconductor device of the present embodiment includes the substrate 20 (see FIG. 1). The material of the substrate 20 is not limited to a particular material but may be organic (e.g., an epoxy substrate) or inorganic (e.g., a ceramic substrate or a glass substrate), or may have a compound structure thereof (e.g., a glass-epoxy substrate). The substrate 20 may be a rigid substrate. Alternatively, the substrate 20 may be a flexible substrate such as a polyester substrate or a polyimide substrate (see FIG. 1). The substrate 20 may be a substrate used for a chip on film (COF). Further, the substrate 20 may be a single-layered substrate made of a single layer or may be a multi-layered substrate having a plurality of laminated layers. In addition, the shape or the thickness of the substrate 20 is not limited to any particular shape or thickness.

The substrate 20 includes the wire pattern 30 containing a plurality of leads 32. The wire pattern 30 may be formed by laminating, or by using a single layer of, any of copper (Cu), chromium (Cr), titan (Ti), nickel (Ni), titan-tungsten (Ti—W), gold (Au), aluminum (Al), nickel vanadium (NiV), and tungsten (W). If a multilayered substrate is prepared for use as the substrate 20, the wire pattern 30 may be mounted between each of the layers. Further, if a glass substrate is used as the substrate 20, the wire pattern 30 may be formed with a metal layer, or a metal-compound layer, of indium tin oxide (ITO), Cr, or Al, for example, or with a mixed layer of such a metal layer and a metal-compound layer. The method for forming the wire pattern 30 is not particularly designated. The wire pattern 30 may be formed, for example, by sputtering or by an additive process in which the wire pattern 30 is formed by electroless plating. Also, the wire pattern 30 may be plated with solder, tin, gold, or nickel, for example.

As shown in FIG. 3, the lead 32 includes the connecting part 34. The connecting part 34 is the part that faces the electrode 12. As shown in FIG. 4, the lead 32 (the wire pattern 30) and the electrode 12 are electrically connected by having the electrode 12 and the connecting part 34 to face each other. The electrical connecting of the electrode 12 and the connecting part 34 may be conducted by having them in contact with one another as shown in FIG. 4. Alternatively, the electrical connecting thereof may be carried out by intervening a conductive particle between the electrode 12 and the connecting part 34 (not shown). Alternatively, for the electrical connecting of the electrode 12 and the connecting part 34, an alloy junction (e.g., an Au—Au or an Au—Sn junction) may be used. As shown in FIG. 3, the lead 32 includes the extension part 36 which extends along the first straight line 110 from the connecting part 34. As shown in FIG. 3, the lead 32 further includes a draw-out part 38 that is drawn from the extension part 36 and extends in a direction so as to intersect with first straight line 110. Additionally, the lead 32 may be formed by integrating the connecting part 34, the extension part 36, and the draw-out part 38 into one form.

According to the semiconductor device of the present embodiment, the lead 32 contains the connecting part 34, the extension part 36, and the draw-out part 38. Since the draw-out part 38 is drawn from the extension part 36, the draw-out part 38 is arranged to move from the connecting part 34 along the first straight line 110. Therefore, the gap between the draw-out part 38 and the connecting part 34 of other lead 32 can be wide. As described earlier, with the semiconductor device of the present embodiment, the connecting part 34 is facing the electrode 12 of the semiconductor chip 10, the gap between the draw-out part 38 and the electrode 12 other than the object electrode will be wide. Therefore, an electrical short circuit between the draw-out part 38 and the electrode 12 does not readily occur, and, thereby, a highly reliable semiconductor device can be provided. As shown in FIG. 2 or FIG. 3, the extension part 36 of one group extending from the connecting part 34 of one group that faces the electrode 12 of an identical second group 320 may be arranged to be on the same side of the connecting part 34 as the sides of two adjacent connecting parts 34 along the first straight line 110. Since the draw-out part 38 is drawn avoiding the extension part 36 of other lead 32, the gap between the draw-out part 38 and the connecting part 34 of other lead 32 will be wider. That is, the gap between the draw-out part 38 and the electrode 12 other than the object electrode will be wider, and, therefore, a more highly reliable semiconductor device can be provided. Additionally, the extension part 36 of one group may include one first extension part and one second extension part that is arranged next to the first extension part extending in a direction opposite to a direction in which the draw-out part 38 extends. Here, the draw-out part 38 drawn from the second extension part may be arranged to move from the first extension part in a direction in which the extension part 38 extends. Further, as shown in FIG. 3, the extension parts 36 of one group may be formed to have the same length.

As shown in FIG. 4, the semiconductor device of the embodiment applying the present invention may further include a reinforcement part 21 that adheres the semiconductor chip 10 to the substrate 20. The reinforcement part 21 can further increase reliability of the semiconductor device. The material of the reinforcement part 21 may be resin but is not limited thereto.

The semiconductor device of the present embodiment is structured as hereinbefore described. The method for manufacturing thereof will be described as follows.

The method for manufacturing the semiconductor device of the present embodiment includes electrically connecting the electrode 12 with the wire pattern 30 by mounting the semiconductor chip 10 having a plurality of electrodes 12 onto the substrate 20 having a plurality of wire pattern 30 containing a plurality of leads 32. The process thereof is described in the following.

Figure 5:
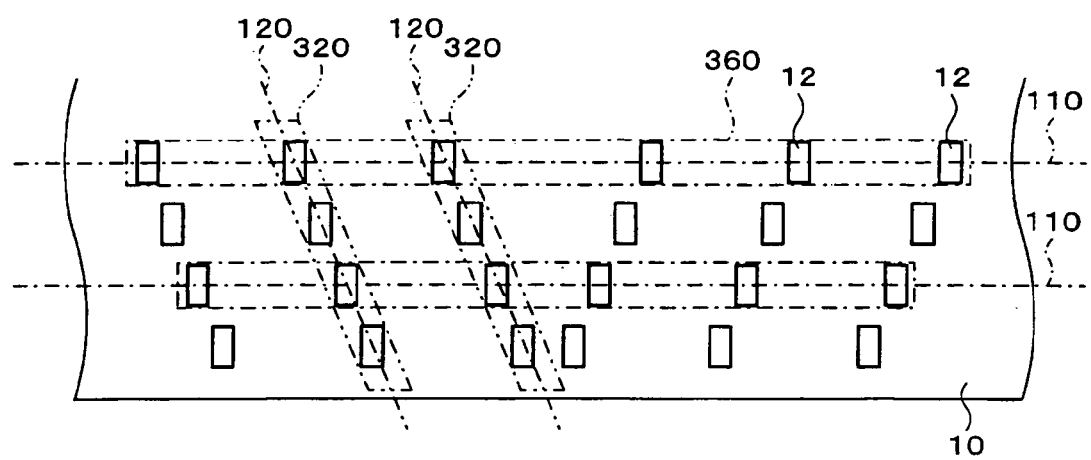
FIG. 5 is a diagram illustrating a method for manufacturing the semiconductor device of the embodiment applying the present invention.

As shown in FIG. 5, the process may include preparing the semiconductor ship 10. The semiconductor chip 10 contains a plurality of electrodes 12. As shown in FIG. 5, the electrodes 12 are arranged to be classified into a plurality of first groups 310 respectively lined along a plurality of paralleling first straight lines 110. As shown in FIG. 5, the first straight line 110 extends along one side of the semiconductor chip 10. The electrodes 12 are arranged to be classified into a plurality of second groups 320 respectively lined along a plurality of second straight lines 120 which extend in a direction so as to intersect with the first straight lines 110.

Figure 6:
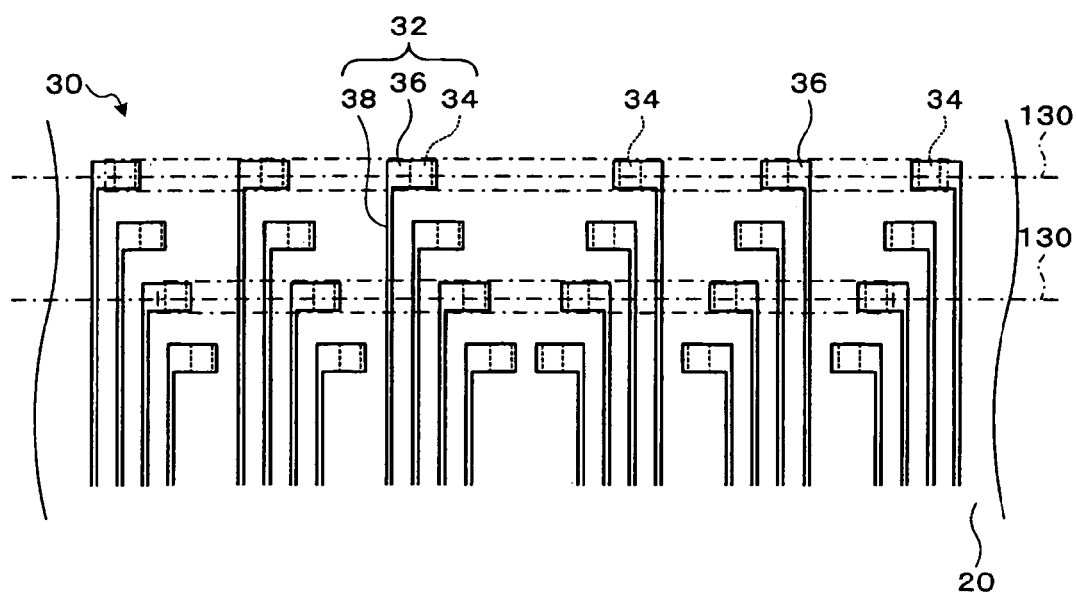
FIG. 6 is a diagram illustrating the method for manufacturing the semiconductor device of the embodiment applying the present invention.

As shown in FIG. 6, the process may include preparing the substrate 20. The substrate 20 contains the wire pattern 30 having a plurality of leads 32. The wire pattern 30 includes a plurality of connecting parts 34. The connecting parts 34 are arranged to be classified into a plurality of third groups 330 respectively lined along a plurality of paralleling third straight lines 130. Further, the lead 32 includes one connecting part 34, the extension part 36 that extends along one third straight line 130 from the connecting part 34, and the draw-out part 38 that is drawn from the extension part 36 and extends in a direction so as to intersect with the third straight line 130 (see FIG. 6 or FIG. 3).

The present process includes aligning the semiconductor chip 10 with the substrate 20 so that the first straight line 110 and the third straight line 130 lie in parallel with each other and so that the electrode 12 faces the connecting part 34 (see FIG. 2). The electrode 12 of one first group 310 may be facing the connecting part 34 of any one of the third groups 330. Then, the electrode 12 and the connecting part 34 are electrically connected. To electrically connect the electrode 12 with the connecting part 34, any well-known method such as an insulating resin junction (e.g., a junction using an NCP or an NCF), an anisotropic conductive-material junction (e.g., a junction using an ACP or an ACF), a metal junction (e.g., an Au—Au or an Au—Sn junction), or a junction by soldering may be employed. Thus, the electrode 12 and the wire pattern 30 may be electrically connected.

Figure 7:
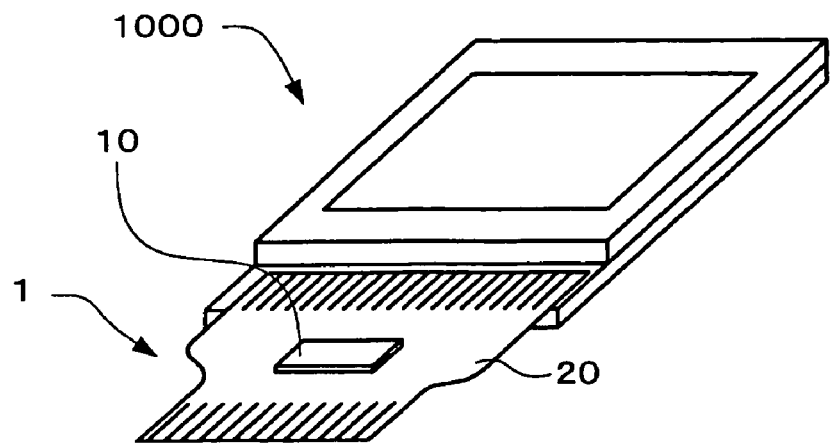
FIG. 7 is a diagram showing a display device containing the semiconductor device of the embodiment applying the present invention.
Figure 8:
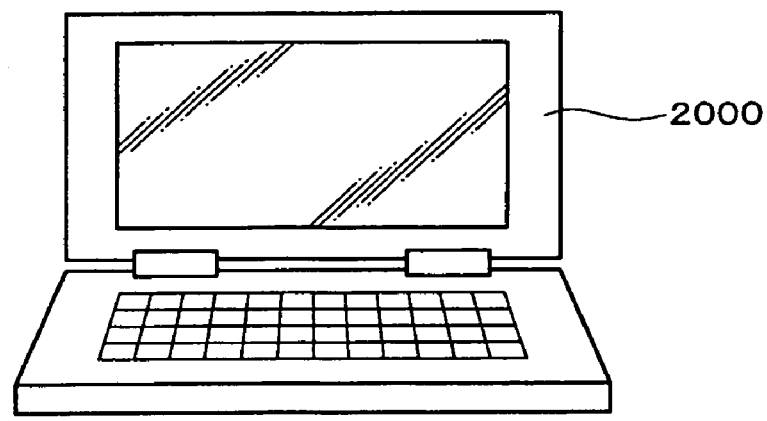
FIG. 8 is a diagram showing an electronic apparatus containing the semiconductor device of the embodiment applying the present invention.
Figure 9:
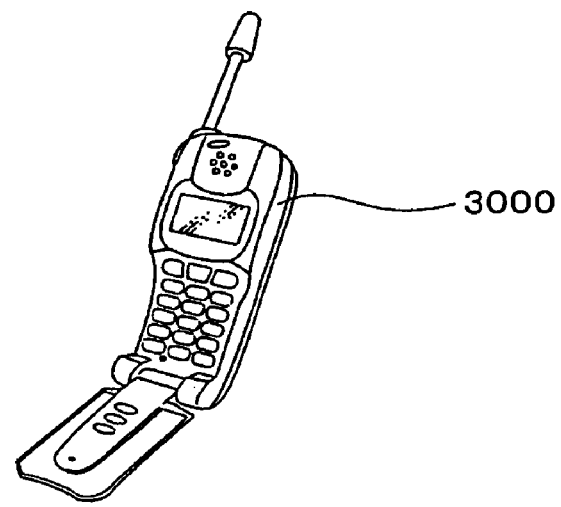
FIG. 9 is a diagram showing an electronic apparatus containing the semiconductor device of the embodiment applying the present invention.

Additionally, the semiconductor device 1 may be manufactured after carrying out a process such as forming the reinforcement part 21 for adhering the semiconductor chip 10 to the substrate 20 (see FIG. 1). FIG. 7 shows a display device 1000 containing the semiconductor device 1. The display device 1000 may be a liquid-crystal display device or an electrical luminescence (EL) display device, for example. Further, as electronic apparatuses containing the semiconductor device 1, a notebook-sized personal computer 2000 and a mobile telephone are shown in FIG. 8 and FIG. 9, respectively.

ALTERNATIVE EXAMPLES

Embodiments of the present invention are not limited to the above-described embodiments but can have various alternatives. Hereafter, alternative examples of the semiconductor device of the embodiments applying the present invention will be described. Further, in the following alternative examples, the descriptions already given above shall be employed whenever applicable.

Figure 10:
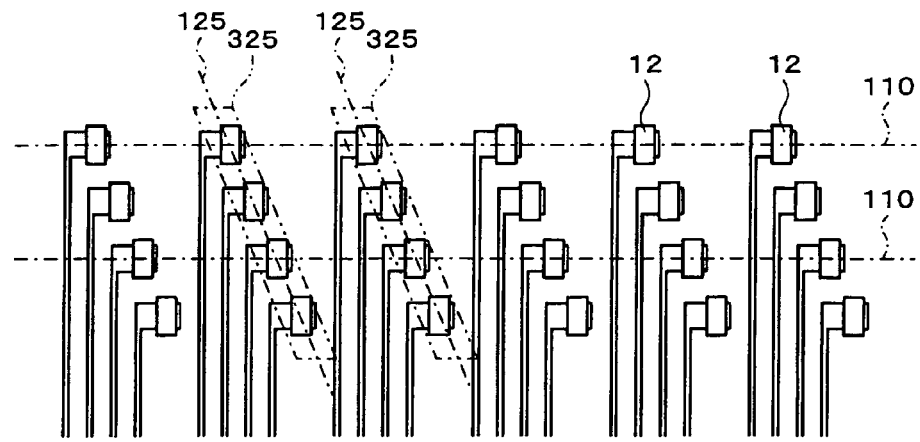
FIG. 10 is a diagram illustrating the semiconductor device of an example alternative to the embodiment applying the present invention.

In an example shown in FIG. 10, the electrodes 12 are arranged to be classified into a plurality of second groups 325 lined along a plurality of second straight lines 125 which extend in a direction so as to intersect with the first straight lines 110. The second straight lines 125 extend diagonally from the first straight lines 110. Also, as shown in FIG. 10, a plurality of second straight lines 125 extend in parallel with each other. This means that all second straight lines 125 may extend in parallel with each other.

Figure 11:
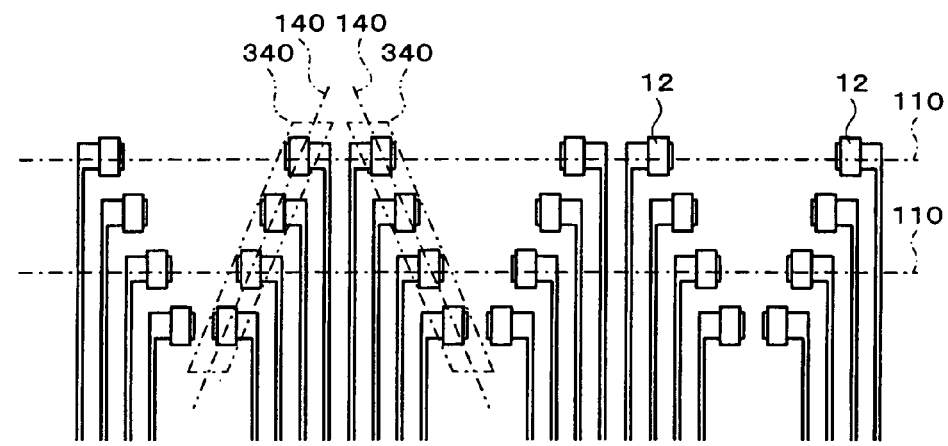
FIG. 11 is a diagram illustrating the semiconductor device of an example alternative to the embodiment applying the present invention.

In an example shown in FIG. 11, the electrodes 12 are arranged to be classified into a plurality of second groups 340 lined along a plurality of second straight lines 140 which extend in a direction so as to intersect with the first straight lines 110. The second straight lines 140 extend diagonally from the first straight lines 110. Also, as shown in FIG. 11, the two adjacent second straight lines 140 are symmetrical around a perpendicular line, as an axis of symmetry, of the first straight line 110.

Figure 12:
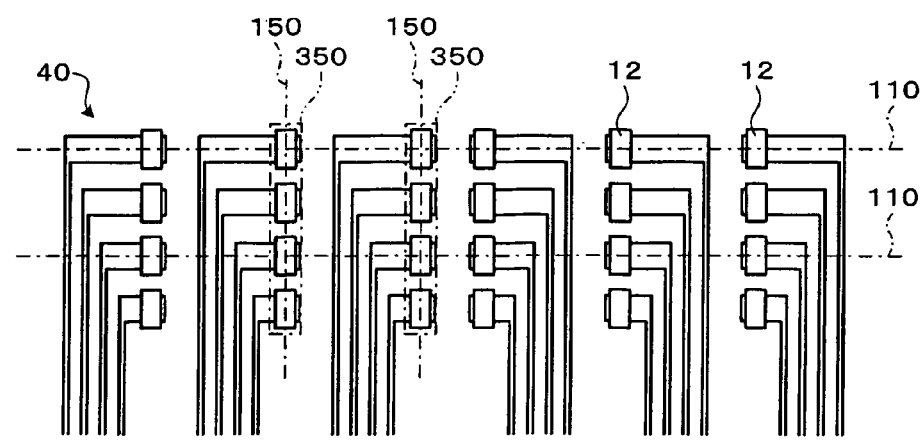
FIG. 12 is a diagram illustrating the semiconductor device of an example alternative to the embodiment applying the present invention.
Figure 13:
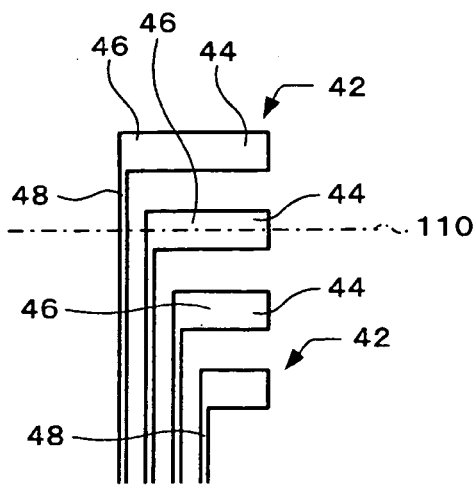
FIG. 13 is a diagram illustrating the semiconductor device of an example alternative to the embodiment applying the present invention.
Figure 14:
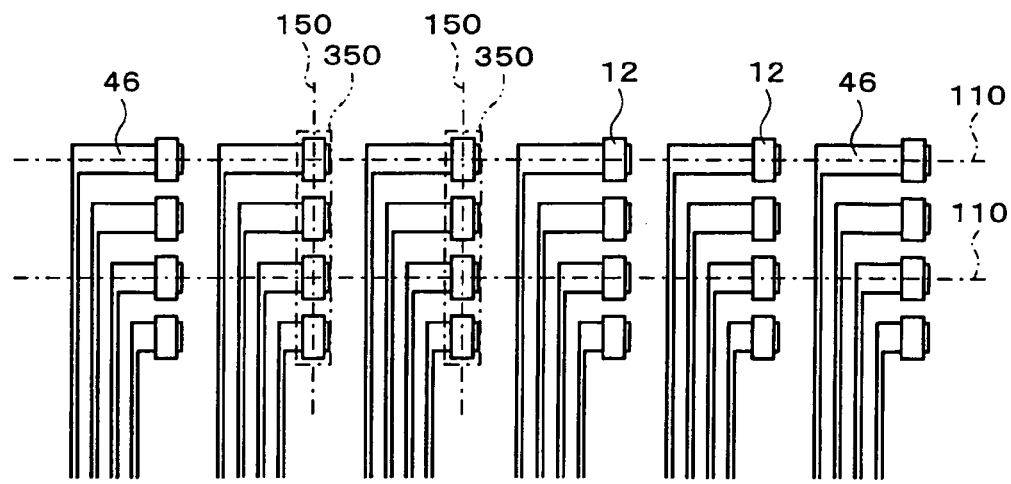
FIG. 14 is a diagram illustrating the semiconductor device of an example alternative to the embodiment applying the present invention.
Figure 15:
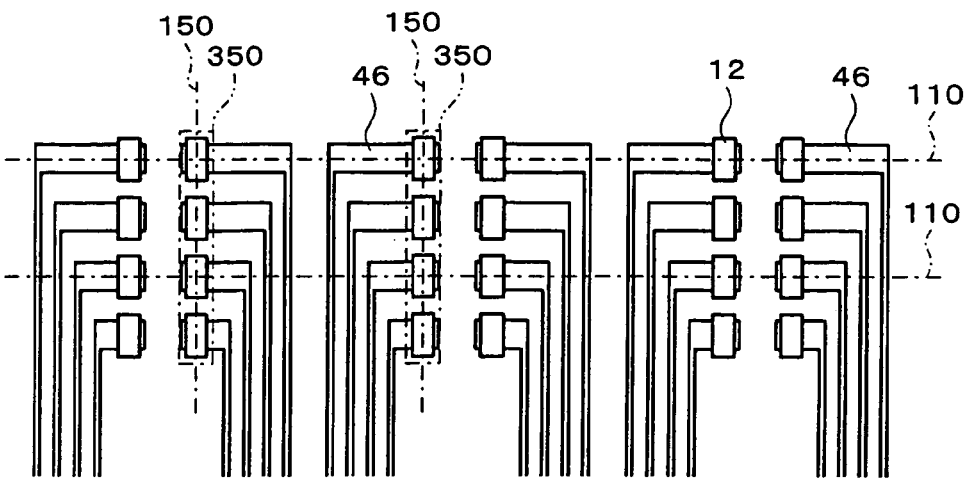
FIG. 15 is a diagram illustrating the semiconductor device of an example alternative to the embodiment applying the present invention.

In an example shown in FIGS. 12 and 13, a plurality of electrodes 12 are arranged to be classified into a plurality of second groups 350 lined along a plurality of second straight lines 150 which extend in a direction so as to intersect with the first straight lines 110. The second straight lines 150 extend perpendicular to the first straight lines 110. Here, the substrate may include a wire pattern 40 containing a plurality of leads 42. As shown in FIG. 13, the lead 42 contains a connecting part 44 facing one electrode 12, an extension part 46 extending from the connecting part 44 along any one of the first straight lines 110, and a draw-out part 48 which is drawn from the extension part 46 and extends in a direction so as to intersect with the first straight line 110. Additionally, FIG. 13 is a partially enlarged diagram of the wire pattern 40 describing the lead 42. As shown in FIG. 12, the extension part 46 of one group extending from the connecting part 44 of one group that faces the electrode 12 of an identical second group 320 may be arranged to be on the same side of the connecting part 44 as the sides of two adjacent connecting parts 44 along the first straight line 110. Also, the extension parts 46 of two adjacent groups may be arranged on the same side of the connecting part 44 along the first straight lines 110 as the sides of two adjacent connecting parts 44 along the first straight line 110. Moreover, the extension parts 46 of one group may be formed to be longer in an order of the arrangement along any second straight line 150 (see FIGS. 12 and 13). Further, in the present alternative example as shown in FIG. 14, all the extension parts 46 may be arranged to be on the same side of the connecting part 44 as the sides of two adjacent connecting parts 44 along the first straight line 110. Alternatively, as shown in FIG. 15, the extension parts 46 of two adjacent groups may be arranged to be on a different side from the sides of two adjacent connecting parts 44 along the first straight line.

In these alternative examples, the same effect can be produced as in the aforementioned embodiments. In addition, as regards to other constructions, any description already given can be employed.

Electronic Device

FIGS. 16 through 19 are diagrams illustrating the electronic device of an embodiment applying the present invention. With the electronic device which will be described below, the descriptions already given shall also be employed whenever applicable.

Figure 16:
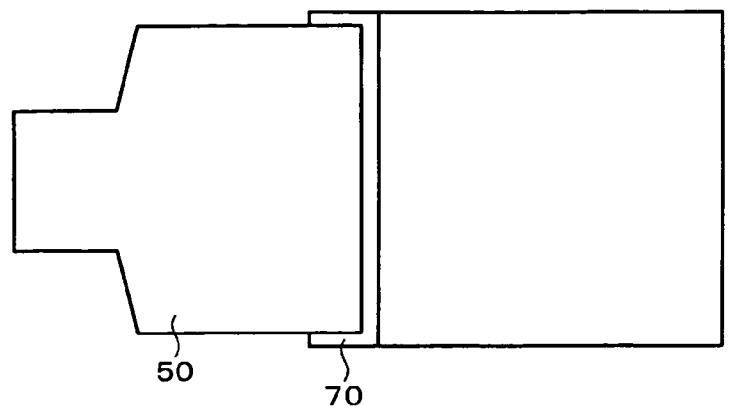
FIG. 16 is a diagram illustrating an electronic device of an embodiment applying the present invention.
Figure 17:
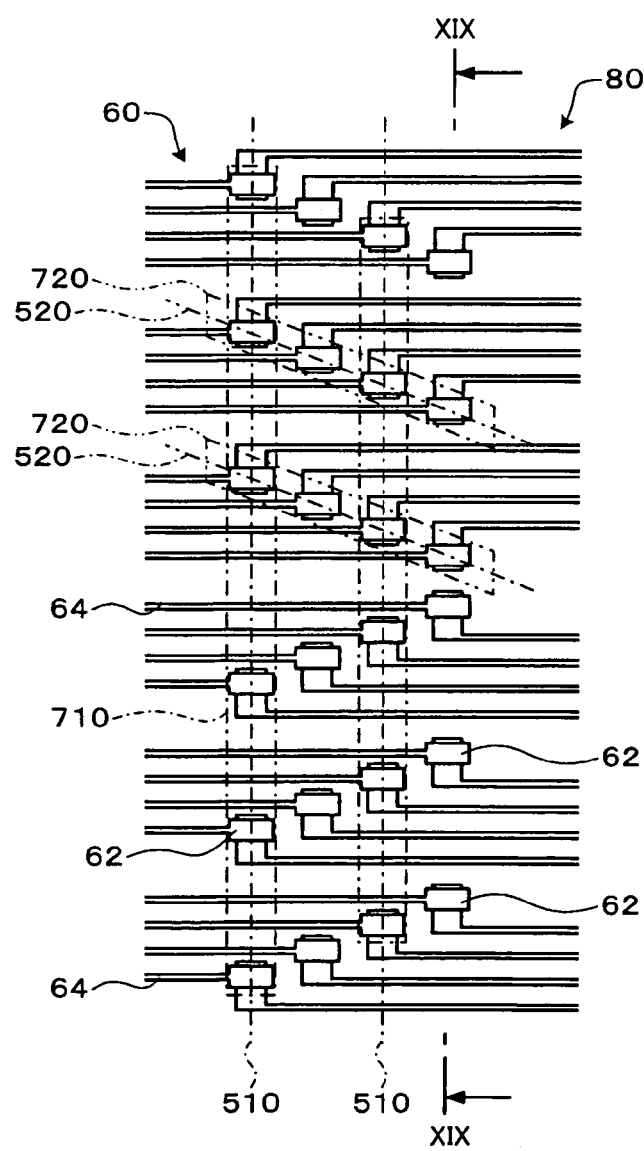
FIG. 17 is a diagram illustrating the electronic device of the embodiment applying the present invention.
Figure 18:
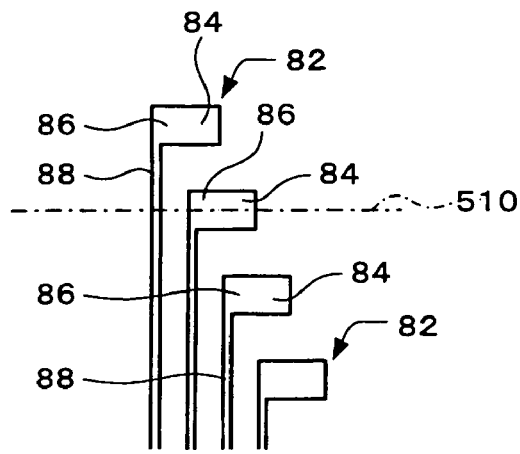
FIG. 18 is a diagram illustrating the electronic device of the embodiment applying the present invention.

FIG. 16 is a diagram outlining an electronic device 2 of the embodiment applying the present invention. Further, FIG. 17 is a partially enlarged diagram of the electronic device 2. However, in FIG. 17, a first substrate 50 and a second substrate 70 are omitted for the convenience of describing a connecting situation of a first wire pattern 60 and a second wire pattern 80. Additionally, FIG. 18 is a partially enlarged diagram of the second wire pattern 80 (a lead 82). Further, FIG. 19 is a partially enlarged, cross-sectional view taken along a line XIX-XIX of FIG. 17.

The electronic device of the present embodiment includes the first substrate 50 and the second substrate 70. The first substrate 50 may be a flexible substrate or a film, for example. Also, the second substrate 70 may be a glass substrate, for example. The second substrate 70 may be a part of an electro-optical panel (e.g., a liquid crystal panel or an electroluminescence panel). However, the first and second substrates 50 and 70 are not limited hereto. For example, as the first substrate, a glass substrate or the like may be used, and, as the second substrate, a flexible substrate or the like may be used.

Figure 19:
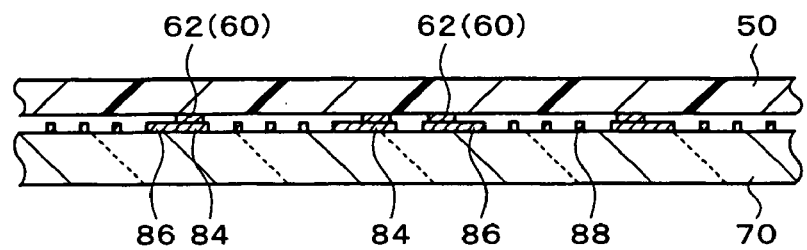
FIG. 19 is a diagram illustrating the electronic device of the embodiment applying the present invention.

The first substrate 50 contains the first wire pattern 60 (see FIGS. 17 and 19). Also, as shown in FIG. 17, the first wire pattern 60 includes a plurality of lands 62. The lands 62 are arranged to be classified into a plurality of first groups 710 respectively lined along a plurality of paralleling first straight lines 510. Further, the lands 62 are arranged to be classified into a plurality of second groups 720 respectively lined along a plurality of second straight lines 520 which extend in a direction so as to intersect with the first straight lines 510. Here, the second straight lines 520 may extend diagonally from the second straight lines 520. Further, as shown in FIG. 17, two adjacent second straight lines 520 may extend in parallel with each other. The first wire pattern 60 includes a wire 64 which is drawn from the land 62 and extends in a direction so as to intersect with the first straight line 510.

The second substrate 70 includes the second wire pattern 80 having a plurality of leads 82 (see FIGS. 17 and 19). As shown in FIG. 18, the lead 82 contains a connecting part 84. The connecting part 84 is the part that the land 62 faces (see FIG. 19). The land 62 (the first wire pattern 60) and the lead 82 (the second wire pattern 80) are electrically connected by having the land 62 and the connecting part 84 to face each other. The lead 82 further contains an extension part 86 that extends from the connecting part 84 along the first straight line 510 and a draw-out part 88 that is drawn from the extension part 86 and extends in a direction so as to intersect with the first straight line 510. Additionally, the lead 82 may be formed by integrating the connecting part 84, the extension part 86, and the draw-out part 88 into one form.

According to the electronic device of the present embodiment, the lead 82 contains the connecting part 84, the extension part 86, and the draw-out part 88. Since the draw-out part 88 is drawn from the extension part 86, the draw-out part 88 is arranged to move from the connecting part 84 along the first straight line 510. Therefore, the gap between the draw-out part 88 and the extension part 84 of other lead 82 can be wide. Further, since the connecting part 84 is facing the land 62 of the first wire pattern 60, the gap between the draw-out part 88 and the land 62 other than the object land will be wide. Therefore, a highly reliable semiconductor device that does not readily generate an electrical short circuit can be provided. As shown in FIG. 17 or FIG. 18, the extension part 86 of one group extending from the connecting part 84 of one group that faces the land 62 of an identical second group 720 may be arranged to be on the same side of the connecting part 84 as the sides of two adjacent connecting parts 84 along the first straight line 510. Since the draw-out part 88 is drawn avoiding the extension part 86 of other lead 82, the gap between the draw-out part 88 and the connecting part 84 of other lead 82 will be wide. Therefore, a more highly reliable semiconductor device can be provided. Additionally, the extension part 86 of one group may include one first extension part and one second extension part that is arranged next to the first extension part extending in a direction opposite from a direction in which the draw-out part 88 extends. Here, the draw-out part 88 drawn from the second extension part may be arranged to move from the first extension part in a direction in which the first extension part extends. Further, as shown in FIGS. 17 and 18, the extension parts 86 of one group may be formed to have the same length. Alternatively, the extension parts 86 of one group may be formed to be longer in an order of the arrangement along the second straight line 520 (not shown).

The semiconductor device of the present embodiment is constructed as hereinbefore described. The method for manufacturing thereof will be described in the following.

The method for manufacturing the electronic device of the present embodiment includes electrically connecting a plurality of lands 62 of the first wire pattern 60 mounted on the first substrate 50 with a plurality of connecting parts 84 of the second wire pattern 80 mounted on the second substrate 70 by having the lands 62 and the connecting parts 84 to face each other. The process thereof will be described in the following.

Figure 20:
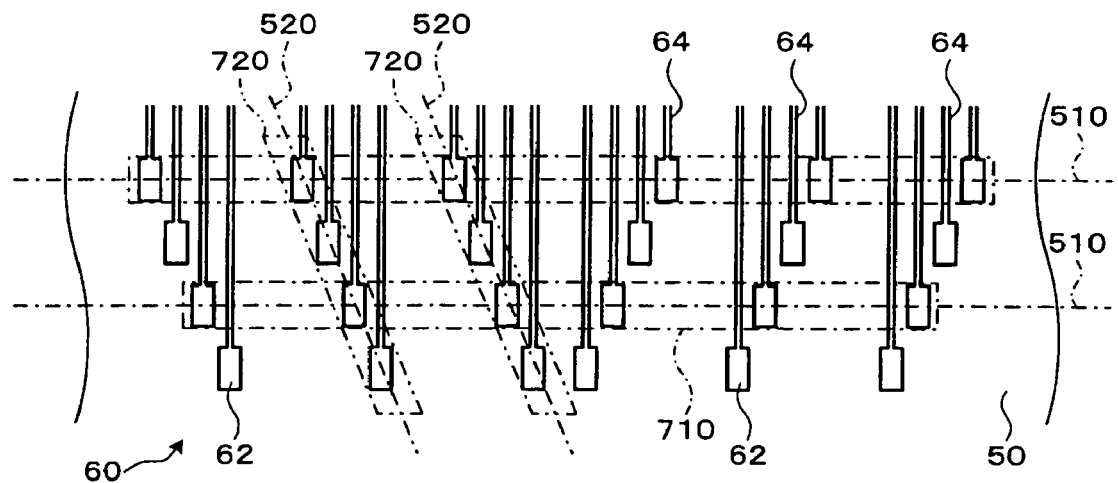
FIG. 20 is a diagram illustrating a method for manufacturing the electronic device of the embodiment applying the present invention.

The process may include preparing the first substrate 50 as shown in FIG. 20. On the first substrate 50, the first wire pattern 60 is mounted. Further, the first wire pattern 60 includes a plurality of lands 62. The lands 62 are arranged to be classified into a plurality of first groups 710 respectively lined along a plurality of paralleling first straight lines 510. Further, the lands 62 are arranged to be classified into a plurality of second groups 720 respectively lined along a plurality of second straight lines 520 which extend in a direction so as to intersect with the first straight lines 510. In addition, the first wire pattern 60 includes the wire 64 which is drawn from the land 62 and extends in a direction so as to intersect with the first straight line 510.

Figure 21:
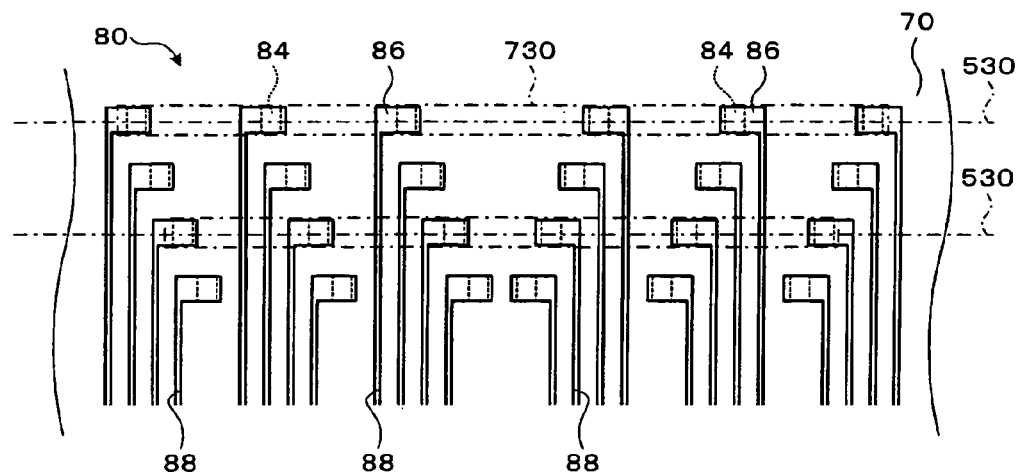
FIG. 21 is a diagram illustrating the method for manufacturing the electronic device of the embodiment applying the present invention.

The process may include preparing the second substrate 70 as shown in FIG. 21. On the second substrate 70, the wire pattern 80 is mounted. Further, the second wire pattern 80 includes a plurality of connecting parts 84. The connecting parts 84 are arranged to be classified into a plurality of third groups 730 respectively lined along a plurality of paralleling third straight lines 530. Further, the second wire pattern 80 includes the extension part 86 that extends along the third straight line 530 from the connecting part 84 and the draw-out part 88 that is drawn from the extension part 86 and extends in a direction so as to intersect with the third straight line 530 (see FIG. 21 or FIG. 18).

The process includes aligning the first substrate 50 with the second substrate 70 so that the first straight line 510 and the third straight line 530 lie in parallel with each other and so that the land 62 faces the connecting part 84 (see FIG. 17). The land 62 of one first group 710 may face the connecting part 84 of any one of the third groups 730. Then, the land 62 and the connecting part 84 are electrically connected. To electrically connect the land 62 with the connecting part 84, any well-known method may be employed.

Additionally, the electronic device 2 may be manufactured after carrying out a process such as forming a reinforcement part for adhering the first substrate 50 to the second substrate 70.

ALTERNATIVE EXAMPLES

Embodiments of the present invention are not limited to the above-described embodiments but can have various alternatives. Hereafter, alternative examples of the electronic device of the embodiments applying the present invention will be described. Further, in the following alternative examples, the descriptions already given above shall be employed whenever applicable.

Figure 22:
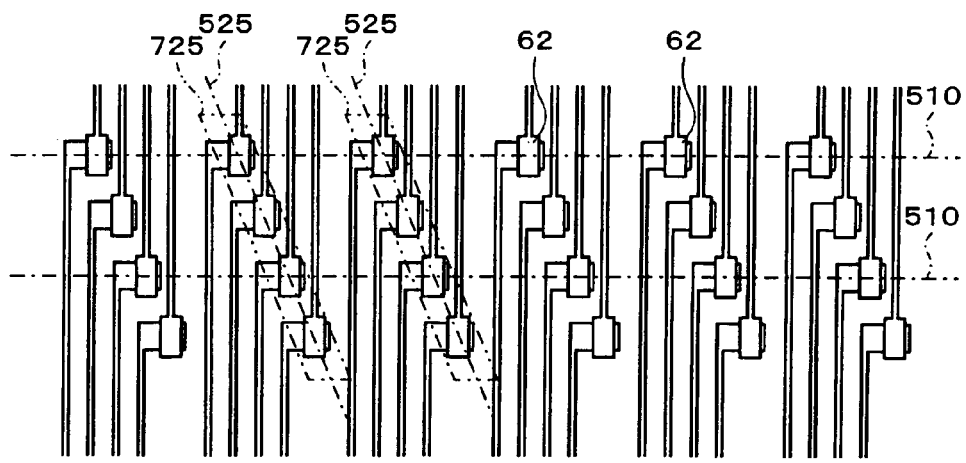
FIG. 22 is a diagram illustrating the electronic device of an example alternative to the embodiment applying the present invention.

In an example shown in FIG. 22, the lands 62 are arranged to be classified into a plurality of second groups 725 lined along a plurality of second straight lines 525 which extend in a direction so as to intersect with the first straight lines 510. The second straight lines 525 extend diagonally from the first straight lines 510. Also, as shown in FIG. 22, a plurality of second straight lines 525 extend in parallel with each other. That is, all second straight lines 525 may extend in parallel with each other.

Figure 23:
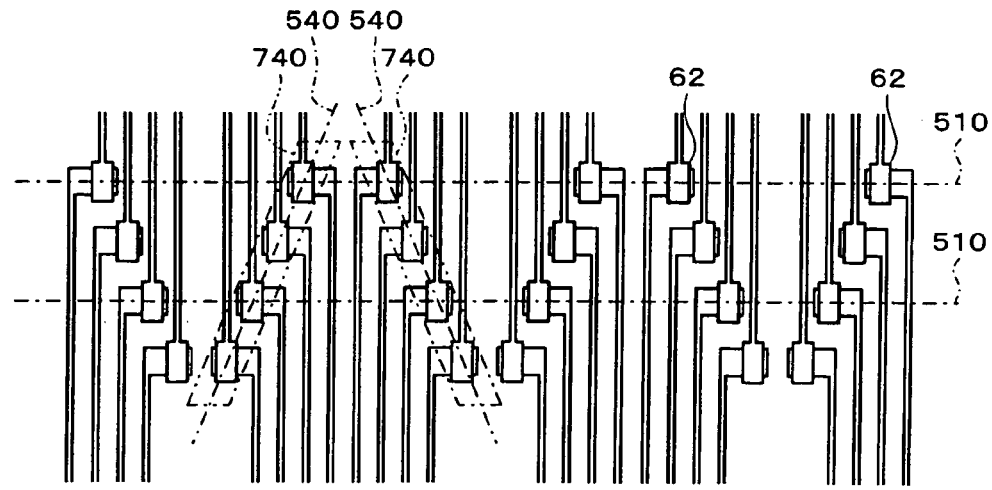
FIG. 23 is a diagram illustrating the electronic device of an example alternative to the embodiment applying the present invention.

In an example shown in FIG. 23, the lands 62 are arranged to be classified into a plurality of second groups 740 lined along a plurality of second straight lines 540 which extend in a direction so as to intersect with the first straight lines 510. Also, as shown in FIG. 23, two adjacent second straight lines 540 are symmetrical around a perpendicular line of the first straight line 510 as an axis of symmetry.

In these alternative examples, the same effect as in the aforementioned embodiments may be produced. In addition, as regards to other constructions, any description already given can be employed.

Further, according to the present invention, embodiments of the present invention are not limited to the above-described embodiments but can have various alternatives. That is, the present invention includes constructions which are, in substance, the same as the constructions described in the embodiments (such as a construction having the same function, method, and result, and a construction having the same object and effect). Further, the present invention includes constructions in that the non-essential elements of the constructions described in the embodiments are replaced with other elements. Furthermore, the present invention includes constructions that exert the same operational effect as with the constructions described in the embodiments. Moreover, the present invention also includes techniques well known in the art in addition to the constructions as described in the embodiments.

What is claimed is:

1. A semiconductor device comprising:
   a substrate having a wire pattern containing a plurality of leads; and
   a semiconductor chip having a plurality of electrodes which are mounted on the substrate so as to face the wire pattern,
   wherein the electrodes are arranged to be classified into a plurality of first groups respectively lined along a plurality of paralleling first straight lines which extend along one side of the semiconductor chip and into a plurality of second groups respectively lined along a plurality of second straight lines which extend in a direction so as to intersect with the first straight lines,
   wherein each of the leads associated with the first groups of electrodes and each of the leads associated with the second groups of electrodes contain a connecting part facing any one of the electrodes, an extension part extending from the connecting part along any one of the first straight lines and in a direction parallel to the first straight lines, and a draw-out part which is drawn from the extension part and extends in a direction so as to intersect with the first straight line,
   wherein a width of the extension part is substantially equal to a width of the connecting part, and
   wherein the width of the extension part and the width of the connecting part are measured in a direction substantially vertical to the first straight lines.

2. The semiconductor device according to claim 1, wherein the extension part extending from the connecting part of one group that faces the electrode of an identical second group is arranged to be on the same side of the connecting part as sides of two adjacent connecting parts along the first straight line.

3. The semiconductor device according to claim 2,
   wherein the extension part of the one group includes one first extension part and one second extension part that is arranged proximate to the first extension part extending in a direction opposite from a direction in which the draw-out part extends, and
   wherein the draw-out part drawn from the second extension part is arranged to move from the first extension part in a direction in which the extension part extends.

4. The semiconductor device according to claim 2, wherein the extension parts of the one group are formed to have a same length.

5. The semiconductor device according to claim 2, wherein the extension parts of the one group are formed to be longer in an order of an arrangement along any second straight line.

6. The semiconductor device according to claim 1, wherein the second straight line extends in a direction perpendicular to the first straight line.

7. The semiconductor device according to claim 1, wherein the second straight line extends diagonally from the first straight line.

8. The semiconductor device according to claim 7, wherein two adjacent second straight lines extend in parallel each other.

9. The semiconductor device according to claim 7, wherein two adjacent second straight lines are symmetrical around a perpendicular line of the first straight line as an axis of symmetry.

10. An electronic device comprising:
a first substrate having a first wire pattern containing a plurality of lands; and
a second substrate having a second wire pattern containing a plurality of leads,
wherein the lands are arranged into a plurality of first groups respectively lined along a plurality of paralleling first straight lines and into a plurality of second groups respectively lined along a plurality of second straight lines which extend in a direction so as to intersect with the first straight lines,
wherein the first wire pattern contains a wire which is respectively drawn from the land and extends in a direction so as to intersect with the first straight line,
wherein each lead contains a connecting part facing any one of the lands, an extension part extending from the connecting part along any one of the first straight lines and in a direction parallel to the first straight lines, and a draw-out part which is drawn from the extension part and extends in a direction so as to intersect with the first straight line; and
wherein a width of the extension part is substantially equal to a width of the connecting part.

11. The electronic device according to claim 10, wherein the extension part of one group extending from the connecting part of one group that faces the land of an identical second group is arranged to be on the same side of the connecting part as sides of two adjacent connecting parts along the first straight line.

12. The electronic device according to claim 11,
wherein the extension part of the one group includes one first extension part and one second extension part which is arranged next to the first extension part in a direction opposite from a direction in which the draw-out part extends, and
wherein the draw-out part drawn from the second extension part is arranged to move from the first extension part in a direction in which the extension part extends.

13. The electronic device according to claim 11, wherein the extension parts of the one group are formed to have the same length.

14. The electronic device according to claim 11, wherein the extension parts of the one group are formed to be longer in an order of an arrangement along any second straight line.

15. The electronic device according claim 10, wherein the second straight line extends diagonally from the first straight line.

16. The electronic device according to claim 15, wherein two adjacent second straight lines extend in parallel with each other.

17. The electronic device according to claim 15, wherein two adjacent second straight lines are symmetrical around a perpendicular line of the first straight line as an axis of symmetry.

18. The electronic device according to claim 10, wherein the width of the extension part and the width of the connecting part are measured in a direction substantially parallel to the first straight lines.

* * * * *